(12) United States Patent
Dijkstra et al.

(10) Patent No.: US 8,183,682 B2
(45) Date of Patent: May 22, 2012

(54) METHODS OF PACKAGING A SEMICONDUCTOR DIE AND PACKAGE FORMED BY THE METHODS

(75) Inventors: Paul Dijkstra, Eindhoven (NL); Roelf Anco Jacob Groenhuis, Nijmegen (NL)

(73) Assignee: NXP B.V., Eindhoven (NL)

( * ) Notice: Subject to any disclaimer, the term of this patent is extended or adjusted under 35 U.S.C. 154(b) by 485 days.

(21) Appl. No.: 12/092,126

(22) PCT Filed: Oct. 27, 2006

(86) PCT No.: PCT/IB2006/053964
§ 371 (c)(1),
(2), (4) Date: Apr. 30, 2008

(87) PCT Pub. No.: WO2007/052199
PCT Pub. Date: May 10, 2007

(65) Prior Publication Data
US 2008/0277772 A1 Nov. 13, 2008

Related U.S. Application Data

(60) Provisional application No. 60/732,683, filed on Nov. 1, 2005.

(51) Int. Cl.
*H01L 23/48* (2006.01)
(52) U.S. Cl. ............... 257/690; 438/15; 29/832

(58) Field of Classification Search .......... 257/690; 438/15; 29/832
See application file for complete search history.

(56) References Cited

U.S. PATENT DOCUMENTS

| | | | |
|---|---|---|---|
| 5,057,461 A * | 10/1991 | Fritz | 29/827 |
| 6,006,981 A | 12/1999 | Madrid | |
| 7,176,582 B2 | 2/2007 | Kloen et al. | |
| 7,247,938 B2 | 7/2007 | Groenhuis et al. | |
| 2004/0099940 A1* | 5/2004 | Standing | 257/693 |
| 2005/0117271 A1* | 6/2005 | De Samber et al. | 361/306.1 |
| 2007/0111393 A1* | 5/2007 | Burghout et al. | 438/123 |

FOREIGN PATENT DOCUMENTS

| | | |
|---|---|---|
| GB | 1185857 A | 3/1970 |
| WO | 03085736 A1 | 10/2003 |
| WO | 2006068642 A1 | 6/2006 |

* cited by examiner

*Primary Examiner* — Ha Tran T Nguyen
*Assistant Examiner* — Shaun Campbell

(57) ABSTRACT

A method of packaging a semiconductor die. The method comprises mounting a semiconductor die to a die attach pad on a carrier and electrically coupling an electrode of the semiconductor die and a contact pad on the carrier with a clip carried by a sacrificial substrate. The method further comprises removing the sacrificial substrate to release the clip. The method may be extended to accommodate a carrier having multiple device regions each with a die attach pad and a contact pad for mounting multiple semiconductor die.

25 Claims, 3 Drawing Sheets

METHODS OF PACKAGING A SEMICONDUCTOR DIE AND PACKAGE FORMED BY THE METHODS

The present invention relates generally to chip packaging and, in particular, methods of forming die packages that utilize clipbonding to electrically couple an electrode of a semiconductor die with a contact pad of a device region on a carrier.

Semiconductor die or chips carrying an integrated circuit may be packaged into a chip package and then surface mounted to a substrate, such as a printed wiring board (PWB) or printed circuit board (PCB), to form an electronic assembly. The packaging of a semiconductor die provides several important functions. Among those functions are protection of the semiconductor die against moisture and other damaging environmental elements, electrical connection to external circuitry, and thermal management of the heat load generated by the semiconductor die.

A common type of chip package is a surface mount device (SMD) that includes contact pads that are connected by solder bonding to complementary contact pads on the printed wiring board. The chip package is manipulated by a placement machine onto a specified location on the printed wiring board and subsequently coupled electrically by solder bonds to the printed wiring board. The printed wiring board provides both the physical structure for mounting and holding the chip package as well as a pattern of conductive traces extending from the contact pads to electrically interconnect the semiconductor chip inside the chip package with other components mounted to the printed wiring board, such as discrete passive components or other semiconductor chips. These additional components include circuitry used for supplying power to, controlling, or otherwise interacting electronically with the integrated circuit of the semiconductor chip inside the chip package.

To form a chip package, the semiconductor chip is mounted to a front side of a metal carrier, such as a leadframe. Conductive paths are established between contact or bond pads on the semiconductor chip and contact or bond pads also on the front side of the carrier. One approach for establishing these conductive paths is a wire bonding process in which individual leads extend from the chip bond pads outwardly beyond the peripheral edges of the chip to the carrier bond pads. The leads, which are defined by fine wire, are bonded at each opposite end to the corresponding bond pads. The conductive paths established by the leads and bond pads supply chip-to-carrier interconnections for power and signal distribution. The coupled semiconductor die and carrier are encapsulated in a protective body of molding material to form a sealed package that protects the semiconductor die and leads. The carrier contact pads are exposed by the encapsulated package for mounting the package to a printed wiring board.

Power electronics packages provide mechanical support, device protection, cooling, and electrical connection and isolation for power semiconductor die that have high current capability. The overall performance of a power electronics package is affected by the packaging. In particular, power semiconductor die include bond pads on a top surface that are typically constituted by an aluminum alloy containing a minor percentage of silicon. The aluminum bond pads typically provide a topside connection with the source and gate of the power semiconductor die. A conventional wire bond process may be used to form an electrical connection with the aluminum bond pads. However, a wire-bond connection has a limited contact area and, therefore, is a source of significant electrical resistance and heat generation during device operation.

Due to the various disadvantages of wire bonding, package manufacturers have resorted to the use of conductive clips as a substitute for wire bonds to establish electrical contacts with the aluminum bond pads of the power semiconductor die inside the die package. The conductive clip is typically placed individually into a position overlying the power semiconductor die and bonded with the aluminum contact pad with a quantity of adhesive or solder. The bond extends over a much larger contact area than available with wire bonding, which improves the current carrying capability of the contact. However, conventional clipbonding operations require a discrete pick and place operation for each of multiple power semiconductor die each having a rear surface attached to a die attach pad on a leadframe. This significantly limits process throughput and hampers high volume packaging operations. Alternatively, another top leadframe may be bonded with the aluminum contact pads of each of multiple power semiconductor die attached to a lower leadframe and then bent by punching during assembly to define the conductive clip. Similarly, this significantly limits process throughput and hampers high volume packaging operations, which increases the cost of packaging. For high yield during assembly, the top leadframe must be accurately aligned with the aluminum contact pad of each of the plural semiconductor die. After assembly and encapsulation with molding compound, the top leadframe represents an additional metal object that must be cut during singulation into discrete packages.

What is needed, therefore, is a method for clipbonding with a semiconductor die inside a die package that overcomes the disadvantages of conventional packaging methods that rely on conductive clips to establish electrical contacts with the bond pads of a semiconductor die inside the die package.

In one embodiment of the present invention, a method of packaging a semiconductor die comprises mounting a semiconductor die to a die attach pad on a carrier and electrically coupling a first portion of a clip carried by a sacrificial substrate with an electrode of the semiconductor die. The method further comprises removing the sacrificial substrate to release the clip.

In another embodiment of the present invention, a method of packaging a plurality of semiconductor die comprises mounting each of the semiconductor die to a die attach pad of a corresponding one of a plurality of device regions on a carrier. The method further comprises electrically coupling a first portion of each of a plurality of clips carried by a sacrificial substrate with an electrode of a corresponding one of the semiconductor die and then removing the sacrificial substrate to release the clips.

The accompanying drawings, which are incorporated in and constitute a part of this specification, illustrate embodiments of the invention and, together with a general description of the invention given above and the detailed description of the embodiments given below, serve to explain the principles of the invention.

Figure 1:
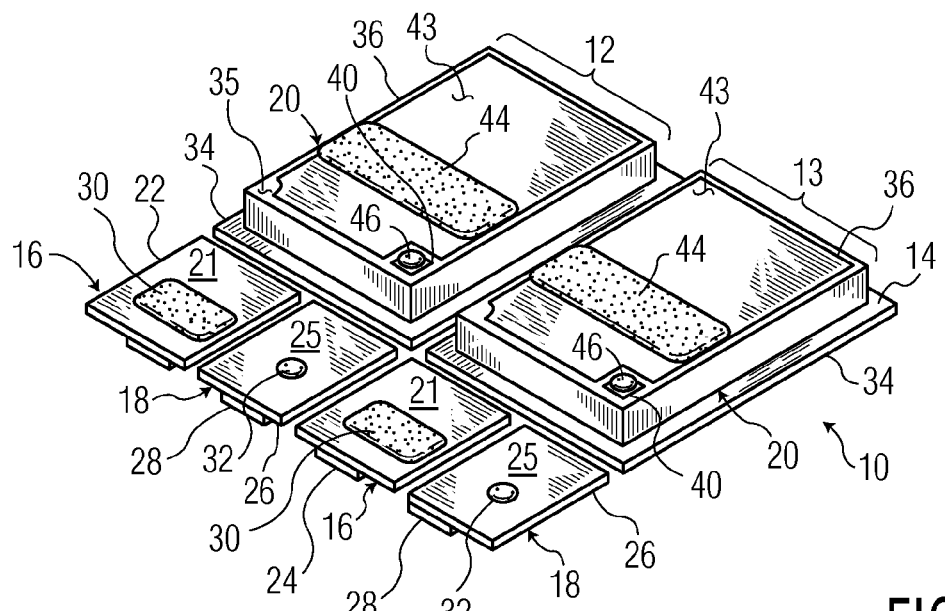
FIGS. 1 through 5 are diagrammatic views of a pair of device regions of a carrier with plural device regions depicted at various processing stages in accordance with an embodiment of the present invention.

The present invention provides methods for forming a package for a power semiconductor die. The present invention will now be described in greater detail by referring to the drawings that accompany the present application.

With reference to FIG. 1 and in accordance with an embodiment of the present invention, a leadframe or carrier 10 includes a matrix or array of device regions, of which a pair of device regions 12, 13 is shown in FIG. 1, arranged across a generally planar surface 14. As used herein, "vertical" means a direction substantially perpendicular to surface 14 and "horizontal" means a direction substantially parallel to surface 14. A plurality of contact pads 16, 18 are located adjacent to each of the device regions 12 and, if present, other device regions of the carrier 10. The contact pads 16, 18 are employed to establish a connection with a semiconductor chip or die 20 attached to each of the device regions 12, 13. The following description of device region 12 applies equally to device region 13, which is substantially identical to device region 12. Additional portions (not shown) of the carrier 10 couple the device regions 12, 13 and the contact pads 16, 18 to form a continuous structure. For example, carrier 10 may constitute a carrier describe in commonly assigned U.S. Pat. No. 7,176,582, issued Feb. 13, 2007 (from application Ser. No. 10/510,591) titled, "Semiconductor Device and Method of Manufacturing Same" and U.S. Pat. No. 7,247,938, issued Jul. 24, 2007 (from application Ser. No.10/510,588) titled, "Carrier, Method of Manufacturing a Carrier and an Electronic Device," each of which is hereby incorporated by reference herein in its entirety.

Contact pad 16 of device region 12 includes a first metallization layer 22 on the same side of the carrier 10 as the semiconductor die 20 and a second metallization layer 24 on an opposite side of the carrier 10 used to establish an electrical contact between the finished package (not shown) and a substrate, such as a printed wiring board. Similarly, contact pad 18 of device region 12 includes a first metallization layer 26 on the same side of the carrier 10 as the semiconductor die 20 and a second metallization layer 28 on an opposite side of the carrier 10. The second metallization layers 24, 28 are used to establish an electrical contact between the semiconductor die 20 inside the finished package (not shown) and a substrate (not shown), such as a printed wiring board.

An amount or quantity 30 of a conductive bonding substance, such as a conductive adhesive or a solderable material such as solder paste or solder, is applied to an exposed surface 21 of the first metallization layer 22 of the contact pad 16. Another amount or quantity 32 of the conductive bonding substance is applied to an exposed surface 25 of the second metallization layer 26 of the contact pad 18. Among other factors, the exact volume or mass of each of the quantities 30, 32 is contingent upon the area across which electrical, mechanical, and thermal contact is established.

The semiconductor die 20 is attached to a die attach pad 34 on the carrier 10 that is located adjacent to the contact pads 16, 18. The semiconductor die 20 includes a first major electrode 36 disposed on a top surface 35 distal to the die attach pad 34 and a second major electrode 38 (FIG. 3A) disposed on a bottom surface 39 (FIG. 3A) proximate to the die attach pad 34. Semiconductor die 20 also includes a smaller control electrode 40 disposed on the top surface 35 and electrically insulated from the first major electrode 36. If the semiconductor die 20 is a power transistor, the first major electrode 36 is a source contact pad, the second major electrode 38 constitutes a drain contact pad, and the control electrode 40 is a gate contact pad. In use, the control electrode 40 modulates the current flowing between the first and second electrodes 36, 38 in response to control signals from an external controller as understood by a person having ordinary skill in the art. The first major electrode 36 and the control electrode 40 may be composed of an aluminum alloy containing a minor amount of silicon.

The second electrode 38 is coupled with the die attach pad 34 by a conductive layer 42 (FIG. 3A) of a conductive adhesive or a high-temperature, heat-conductive solder, often a eutectic solder. Conductive layer 42 provides a direct electrical connection between the second electrode 38 and the die attach pad 34.

Disposed on an exposed surface 43 of the first electrode 36 is an amount or quantity 44 of a conductive bonding substance, such as a conductive adhesive or a solderable material such as solder paste or solder. Another amount or quantity 46 of the conductive bonding substance is disposed on the exposed surface of the control electrode 40. Among other factors, the volume or mass of each of the quantities 44, 46 is contingent upon the area across which electrical, mechanical, and thermal contact is established.

Figure 2:
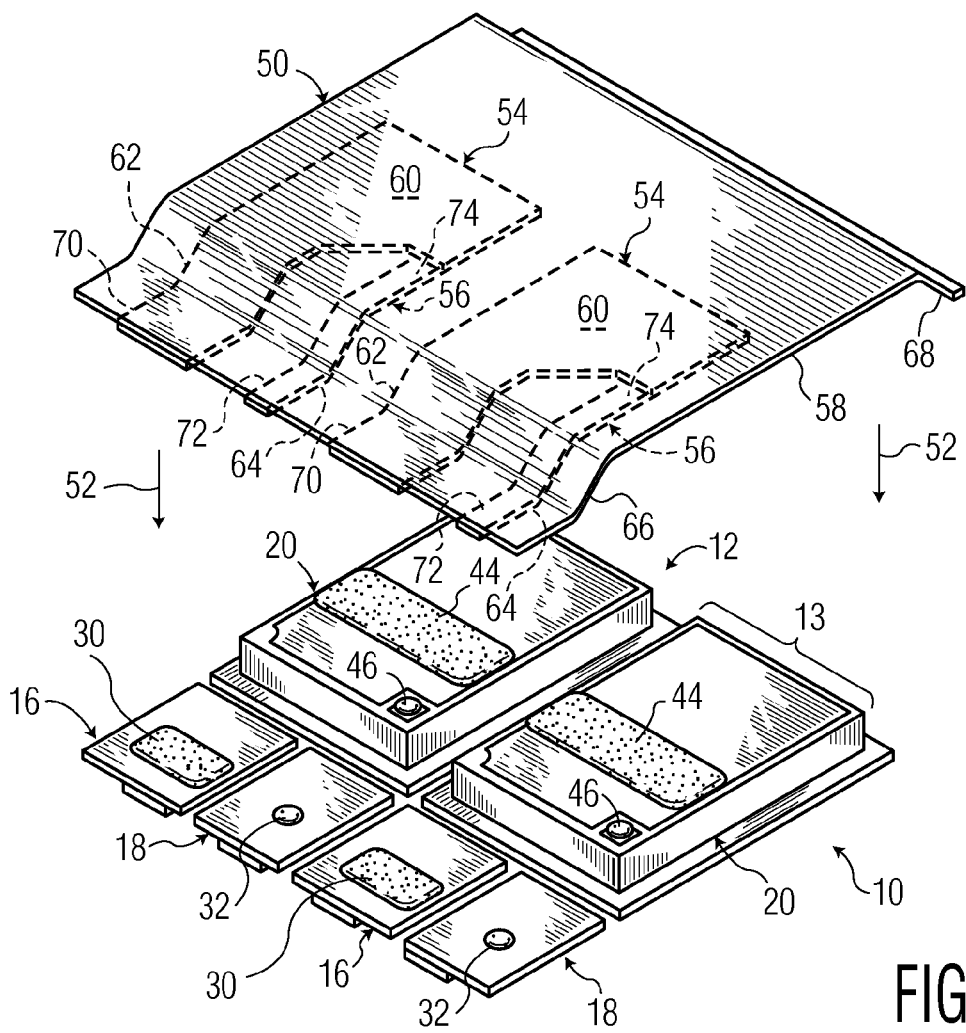

With reference to FIG. 2 in which like reference numerals refer to like features in FIG. 1 and at a subsequent processing stage, a patterned and pre-formed top frame 50 is located in a generally overlying relationship spaced from the carrier 10. The top frame 50 is moved vertically as indicated by arrows 52 into a contacting relationship with the semiconductor die 20 and the contact pads 16, 18.

The top frame 50 includes clips 54, 56 carried on and bonded with a sacrificial substrate 58. The sacrificial substrate 58 is composed of a material that may be etched by an appropriate wet or dry etching process selective to the conductive material (e.g., metal) constituting the clips 54, 56 and without damaging the carrier 10. Similarly, the conductive material or materials constituting clips 54, 56 may be etched by an appropriate wet or dry etching process selective to the material constituting the sacrificial substrate 58 and without damaging the carrier 10. The clips 54, 56 are separated from each other by regions of the substrate 58. When substrate 58 is removed, as described below, the clips 54, 56 are electrically isolated from each other.

The clips 54, 56 are formed from a layer of conductive material having a nominally uniform thickness that is deposited by a conventional process, such as electroplating, or laminated by a conventional process on the sacrificial substrate 58. This layer is patterned to define the clips 54, 56 by a conventional lithography and wet or dry etching process that protects portions of the metal layer with an etch mask and removes unprotected portions of the layer selective to the material constituting the sacrificial substrate 58. Etching is a subtractive process in the course of which unmasked portions of the layer are either dissolved in liquid chemicals (i.e., wet etching) or converted into volatile gaseous compound (i.e., dry etching).

In one embodiment of the present invention, the metal sheet patterned into clips 54, 56 is composed of copper or a copper alloy of which the bulk of the alloy composition is copper and the sacrificial substrate 58 is composed of aluminum or an aluminum alloy of which the bulk of the alloy composition is aluminum. In this instance, the pattern can be applied lithographically on the copper or copper alloy followed by a wet copper etch selective to aluminum.

Clip 54, which is larger in area than clip 56, includes a major pad 60 and an appendage or arm 62 extending away from the major pad 60. Clip 56 consists of a strip 64 that extends on sacrificial substrate 58 generally in the same direction as arm 62 of clip 54. The top frame 50 includes a pair of smoothly-curved and generally parallel bends 66, 68 that are formed by deforming the top frame 50. Bend 66 operates to change the elevation of a free end 70 of the arm 62 and an end 72 of strip 64 to account for relative differences in elevation among the top surface 35 of the semiconductor die 20 and the exposed top surfaces 21, 25 of the contact pads 16, 18, respectively.

Figure 3:
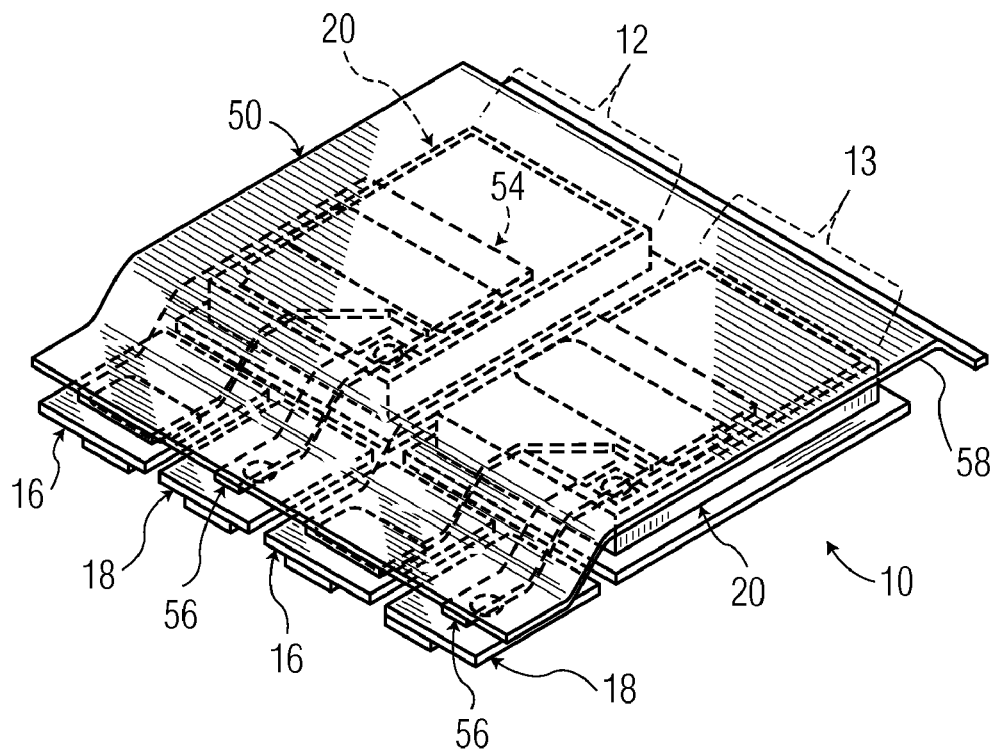
Figure 3A:
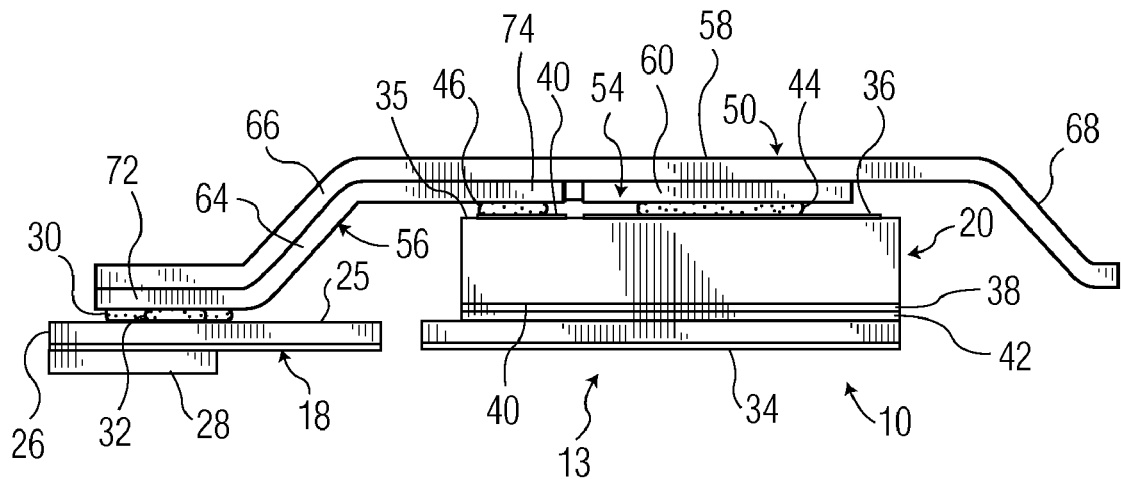
FIG. 3A is a diagrammatic side view of the carrier of FIG. 3.

With reference to FIG. 3 in which like reference numerals refer to like features in FIG. 2 and at a subsequent processing stage, the top frame 50 is moved such that quantities 44, 46 of the conductive bonding substance contact a bottom side of the major pad 60 of clip 54 and a bottom side of an end 74 of the strip 64, respectively. Because of the presence of the bend 66 in the top frame 50, the free end 70 of the arm 62 of clip 54 and the end 72 of strip 64 of clip 56 contact the quantities 30, 32 of the conductive bonding substance. If the conductive bonding substance is solder or solder paste, a soldering process, generally accomplished by wave soldering, infrared (IR) reflow soldering, convective IR reflow soldering, or vapor phase reflow soldering, is used to establish metallic or intermetallic bonds between the clips 54, 56, the contact pads 16, 18, and the semiconductor die 20. If the conductive bonding substance is an adhesive, a curing process, such as heating, is used to establish corresponding adhesive bonds.

Figure 4:
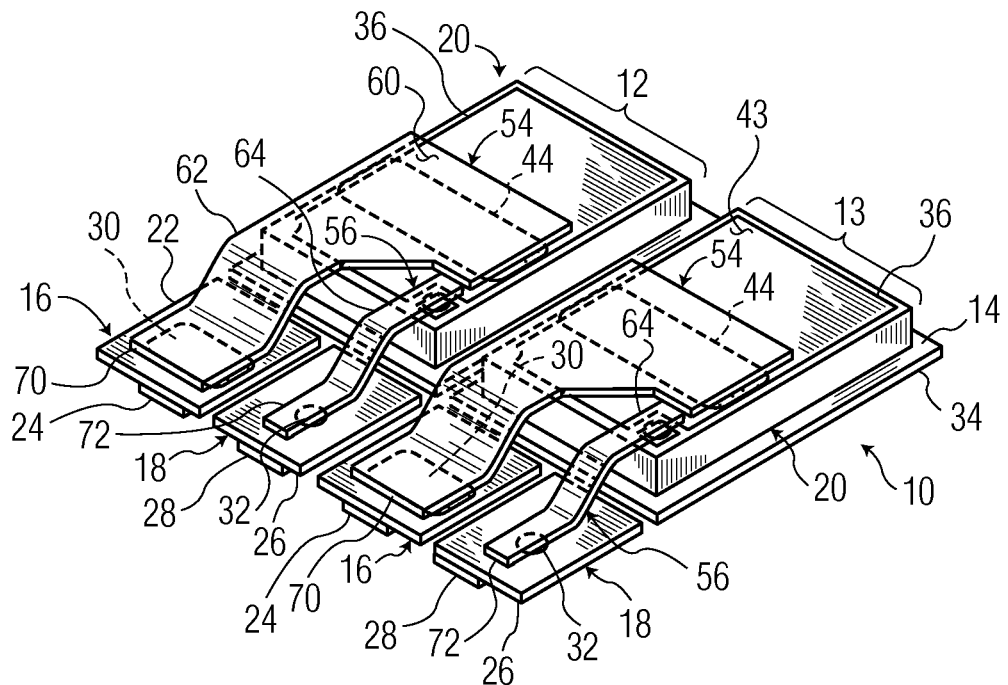

With reference to FIG. 4 in which like reference numerals refer to like features in FIG. 3 and at a subsequent processing stage, the sacrificial substrate 58 is removed using a wet or dry etching process that removes the material constituting sacrificial substrate 58 selective to the material constituting the carrier 10 and the clips 54, 56. The clips 54, 56 are thereby released from the substrate 58 and, after release, are electrically isolated from each other. For example, if the clips 54, 56 are composed of copper or a copper alloy and the sacrificial substrate 58 is aluminum or an aluminum alloy, an appropriate wet etchant is a heated alkali bath of potassium hydroxide (KOH) or sodium hydroxide (NaOH) solution for a time sufficient to completely etch away the substrate 58, which leaves the clips 54, 56 as independent, electrically isolated structures and frees the clips 54, 56 from substrate 58. The etching time will depend upon the thickness of the substrate 58. Heating the etchant bath to, for example, 50° C. elevates the etching rate and, hence, decreases the etching time.

Figure 5:
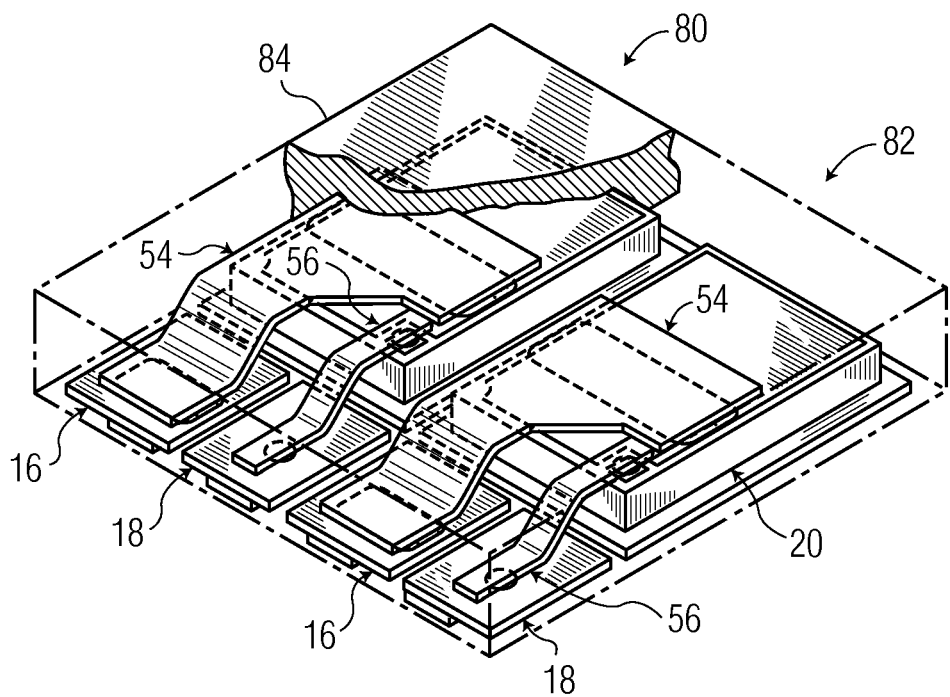

With reference to FIG. 5 in which like reference numerals refer to like features in FIG. 4 and at a subsequent processing stage, the contacts 16, 18 are readied by standard fabrication processes for electrically coupling the semiconductor die 20 with a substrate, such as a printed wiring board (not shown). Die packages 80, 82 are completed by applying a body 84 of molding compound to the carrier 10 by any suitable molding technique as understood by a person having ordinary skill in the art. For example, the body 84 may be applied to the carrier 10 by overmolding in a suitable mold tray. The body 84 of molding compound is cured and at least partially hardened, using techniques that are also known in the art, such as oven curing. For example, the molding compound body 84 may be formed by transfer or injection molding over the carrier 10. The molding compound body 84 fully encapsulates the carrier 10, contact pads 16, 18, and semiconductor die 20 and fills any open spaces with the exception of the second metallization layers 24, 28 of contact pads 16, 18, respectively, which are exposed and not otherwise contaminated by extraneous molding compound.

The die packages 80, 82, each of which includes one semiconductor die 20, are separated or singulated along a line between the device regions 12, 13 by cutting through the body 84 of molding compound. The singulating operation may be performed using a technique, such as sawing using a wafer saw, known to a person having ordinary skill in the art. The die packages 80, 82 may be electrically mounted, after being singulated, to the substrate (e.g., printed wiring board). The outer molding compound body 84 prevents the ingress of environmental contaminants.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of packaging a semiconductor die, comprising:

mounting a semiconductor die to a die attach pad on a carrier;

after mounting the die to the die attach pad, positioning a sacrificial substrate adjacent the die and the carrier, and electrically coupling a first portion of a first clip carried by the sacrificial substrate with a first electrode of the semiconductor die, and electrically coupling a second portion of the first clip with a first contact pad on the carrier that is adjacent the die attach pad, the first electrode being on a surface of the semiconductor die that is opposite a surface of the semiconductor die directly coupled to the die attach pad; and after respectively coupling the first and second portions of the first clip, removing the sacrificial substrate from the first clip.

2. The method of claim 1, wherein positioning the sacrificial substrate adjacent the die and the carrier includes contacting the first and second portions of the first clip respectively with the first electrode and first contact pad on the carrier before the sacrificial substrate is removed.

3. The method of claim 2 wherein the first electrode and the first contact pad are located in different horizontal planes on the carrier, and further comprising:

bending the sacrificial substrate so that the first and second portions of the first clip have different elevations to compensate for the different horizontal planes of the first electrode the first contact pad.

4. The method of claim 1 wherein electrically coupling the first portion of the first clip further comprises:

applying a quantity of a conductive adhesive to a first electrode on the semiconductor die;

contacting the first portion of the first clip with the quantity of the conductive adhesive;

and curing the quantity of the conductive adhesive to adhesively couple the first portion of the clip with the first electrode.

5. The method of claim 1 wherein electrically coupling the first portion of the first clip further comprises:

applying a quantity of a solderable material to a first electrode on the semiconductor die;

contacting the first portion of the clip with the quantity of the solderable material;

and reflowing the quantity of the solderable material to bond the first portion of the clip with the first electrode.

6. The method of claim 1 wherein the sacrificial substrate is formed from a first material and the first clip is formed from a second material, and removing the sacrificial substrate further comprises:

etching the sacrificial substrate to remove the first material selective to the second material.

7. The method of claim 6 wherein the first material is aluminum or an aluminum alloy and the second material is copper or a copper alloy, and etching the sacrificial substrate further comprises:
immersing at least the sacrificial substrate in an alkali bath having a chemistry that reacts with the first material selectively to the second material.

8. The method of claim 7 wherein the alkali bath comprises a heated alkali bath of an aqueous potassium hydroxide solution or an aqueous sodium hydroxide solution.

9. The method of claim 1 further comprising:
depositing a layer of a conductive material on the sacrificial substrate;
and patterning the layer to define the first clip.

10. The method of claim 9 wherein patterning the first layer further comprises: applying an etch mask to protect regions of the layer correlated with a shape of the clip;
and completely removing unprotected regions of the layer with an etching process to transfer the shape from the etch mask to the layer.

11. The method of claim 1 further comprising:
overmolding the carrier with a body of molding compound to encapsulate the semiconductor die and the first clip and, thereby, define a die package.

12. The method of claim 1 further comprising, after mounting the die and before the sacrificial substrate is removed:
electrically coupling a first portion of a second clip carried by the sacrificial substrate with a second electrode of the semiconductor die;
electrically coupling a second portion of the second clip with a second contact pad on the carrier; and
wherein removing the sacrificial substrate includes removing the sacrificial substrate from the second clip.

13. A method of packaging a plurality of semiconductor die, comprising:
mounting each of the semiconductor die to a die attach pad of a corresponding one of a plurality of device regions on a carrier;
after mounting each die, electrically coupling a first portion of each of a plurality of clips carried by a sacrificial substrate with an electrode of a corresponding one of the semiconductor die and with respective contact pads on the carrier; and
removing the sacrificial substrate from the clips.

14. The method of claim 13 further comprising:
electrically coupling a second portion of each of the clips with a corresponding one of a plurality of contact pads on the carrier before the sacrificial substrate is removed.

15. The method of claim 14 wherein the electrodes and the contact pads are located in different horizontal planes on the carrier, and further comprising:
bending the sacrificial substrate so that the first and second portions of each of the clips have different elevations to compensate for the different horizontal planes of the electrodes and the contact pads.

16. The method of claim 13 wherein the sacrificial substrate is formed from a first material and the clips are formed from a second material, and removing the sacrificial substrate further comprises:

etching the sacrificial substrate to remove the first material selective to the second material.

17. The method of claim 16 wherein the first material is aluminum or an aluminum alloy and the second material is copper or a copper alloy, and etching the sacrificial substrate further comprises:
immersing at least the sacrificial substrate in an alkali bath having a chemistry that reacts with the first material selectively to the second material.

18. The method of claim 17 wherein the alkali bath comprises a heated alkali bath of an aqueous potassium hydroxide solution or an aqueous sodium hydroxide solution.

19. The method of claim 13 further comprising:
depositing a layer of a conductive material on the sacrificial substrate;
and patterning the layer to define the clips.

20. The method of claim 19 wherein patterning the first layer further comprises:
applying an etch mask to protect regions of the layer correlated with a shape of each of the clips;
and completely removing unprotected regions of the layer with an etching process to transfer the shape of each of the clips from the etch mask to the layer.

21. The method of claim 13 further comprising:
overmolding the carrier with a body of molding compound to encapsulate the device regions with the plurality of semiconductor die and the clips.

22. The method of claim 21 further comprising:
separating the device regions from the carrier to define a plurality of die packages each including a corresponding one of the device regions and a corresponding one of the semiconductor die.

23. A semiconductor package comprising:
a semiconductor die having a first electrode and a second electrode respectively on first and second opposing surfaces thereof;
a carrier supporting the semiconductor die, the carrier including a first contact pad and at least one device region having a die attach pad coupled with the semiconductor die via the first electrode at the first surface, the second electrode of the semiconductor die being exposed when the semiconductor die is coupled with the die attach pad; and
a first clip electrically coupling the first contact pad with the second electrode of the semiconductor die, the first clip being supported by a sacrificial substrate configured and arranged for selective removal relative to the first clip.

24. The semiconductor package of claim 23 wherein the semiconductor die further includes a second electrode and the device region of the carrier includes a second contact pad, and further comprising:
a second clip electrically coupling the second contact pad with the second electrode of the semiconductor die, the second clip being supported by the sacrificial substrate.

25. The semiconductor package of claim 24 wherein the first clip and the second clip are respectively bent to contact the first and second electrodes in a first plane, and to contact the first and second contact pads in a second plane that is offset from the first plane.

* * * * *